(12) United States Patent
Kwak et al.

(10) Patent No.: US 8,339,849 B2
(45) Date of Patent: Dec. 25, 2012

(54) SEMICONDUCTOR DEVICE AND LAYOUT METHOD FOR THE SEMICONDUCTOR DEVICE

(75) Inventors: Pan-suk Kwak, Gyeonggi-do (KR); Doo-youl Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 697 days.

(21) Appl. No.: 12/498,833

(22) Filed: Jul. 7, 2009

(65) Prior Publication Data

US 2010/0124114 A1    May 20, 2010

(30) Foreign Application Priority Data

Nov. 17, 2008    (KR) .................. 10-2008-0114030

(51) Int. Cl.
*G11C 11/34*    (2006.01)
*G11C 16/34*    (2006.01)

(52) U.S. Cl. ............... 365/185.05; 365/63; 438/128; 257/E21.602

(58) Field of Classification Search ............ 365/185.05, 365/63; 438/128; 257/E21.602
See application file for complete search history.

(56) References Cited

U.S. PATENT DOCUMENTS

| 7,885,114 B2* | 2/2011 | Park et al. ............... 365/185.17 |
| 2006/0077702 A1* | 4/2006 | Sugimae et al. ............ 365/63 |
| 2009/0263749 A1* | 10/2009 | Sim et al. ................... 430/319 |

FOREIGN PATENT DOCUMENTS

| KR | 100221024 B1 | 6/1999 |
| KR | 1020010092073 A | 10/2001 |
| KR | 1020050064666 A | 6/2005 |

* cited by examiner

*Primary Examiner* — Toan Le
(74) *Attorney, Agent, or Firm* — Myers Bigel Sibley & Sajovec, P.A.

(57) ABSTRACT

Provided is a semiconductor device comprising: a plurality of bit line patterns; a plurality of pad patterns that are respectively connected to the plurality of bit line patterns; and at least one contact that is formed on each of the plurality of pad patterns, wherein the pitch of the plurality of pad patterns is greater than the pitch of the plurality of bit line patterns. The bit line patterns may be formed using a double patterning technology (DPT).

18 Claims, 4 Drawing Sheets

FIG. 4

Page Buffer (460) — PBP8
CONP2
PBP4
Page Buffer (450)
PBP3
BLP1
BLP2
Main Array (410)
BLP3
BLP4
BLP5
BLP6
2F
3F
1F
PBP1
PBP2
Page Buffer (430)
PBP5
PBP6
CONP1
Page Buffer (440)
PBP7

SEMICONDUCTOR DEVICE AND LAYOUT METHOD FOR THE SEMICONDUCTOR DEVICE

REFERENCE TO PRIORITY APPLICATION

This application claims the benefit of Korean Patent Application No. 10-2008-0114030, filed Nov. 17, 2008, the disclosure of which is hereby incorporated herein in its entirety.

BACKGROUND

The inventive concept relates to a semiconductor device and a layout method for the semiconductor device, and more particularly, to a semiconductor device in which bit line patterns and page buffer patterns having a pitch different from that of the bit line patterns can be connected to each other and a layout method for the semiconductor device.

NAND flash memory devices include memory cell array regions and page buffer regions. In this regard, it is important to connect bit line patterns, which belong to the memory cell array region, and page buffer patterns, which belong to the page buffer region.

SUMMARY

The inventive concept provides a semiconductor device in which bit line patterns and page buffer patterns having a pitch different from that of the bit line patterns can be connected to each other and a layout method for the semiconductor device.

According to an aspect of the inventive concept, there is provided a semiconductor device comprising: a plurality of bit line patterns; a plurality of pad patterns that are respectively connected to the plurality of bit line patterns; and at least one contact that is formed on each of the plurality of pad patterns, wherein the pitch of the plurality of pad patterns is greater than the pitch of the plurality of bit line patterns. The bit line patterns may be formed using a double patterning technology (DPT).

The plurality of bit line patterns and the plurality of pad patterns may be formed in a memory cell array region of the semiconductor device. The lengths of the plurality of bit line patterns may be different from each other. Some of the plurality of pad patterns may be respectively connected to ends of some of the plurality of bit line patterns having lengths different from one another, and the remaining pad patterns may be respectively connected to the other ends of the remaining bit line patterns having lengths different from one another.

The semiconductor device may further comprise a plurality of page buffer patterns that are respectively connected to the plurality of bit line patterns or the plurality of pad patterns via the contact, wherein the pitch of the plurality of page buffer patterns are greater than the pitch of the plurality of bit line patterns. The page buffer patterns may be formed on a layer that is different from the layer on which the bit line patterns are formed.

According to another aspect of the inventive concept, there is provided a semiconductor device comprising: a plurality of bit line patterns; and a plurality of page buffer patterns that are respectively connected to the plurality of bit line patterns, wherein the plurality of bit line patterns are connected to the plurality of page buffer patterns in a page buffer region, and the pitch of the plurality of page buffer patterns is greater than the pitch of the plurality of bit line patterns.

The plurality of page buffer patterns may be formed on a layer that is the same as a layer on which the plurality of bit line patterns are formed.

According to another aspect of the inventive concept, there is provided a layout method for a semiconductor device, the method comprising: forming a plurality of bit line patterns on a first layer; forming a plurality of pad patterns on the first layer, wherein the plurality of pad patterns are respectively connected to ends of the plurality of bit line patterns; forming a plurality of page buffer patterns on a second layer that is formed upper than the first layer; forming a plurality of connect patterns on the second layer, wherein the plurality of connect patterns are respectively connected to the plurality of pad patterns; and forming at least one contact that vertically connect the plurality of pad patterns on the first layer and the plurality of connect patterns on the second layer, wherein the pitch of the plurality of pad patterns is greater than the pitch of the plurality of bit line patterns.

According to another aspect of the inventive concept, there is provided a layout method for a semiconductor device, the method comprising: forming a plurality of bit line patterns on a first layer; and forming a plurality of page buffer patterns on the first layer, wherein the plurality of page buffer patterns are respectively connected to the plurality of bit line patterns in a page buffer region, wherein some of the plurality of page buffer patterns are respectively connected to ends of some of the plurality of bit line patterns, and the remaining page buffer patterns are respectively connected to the other ends of the remaining bit line patterns, and the pitch of the plurality of page buffer patterns is greater than the pitch of the plurality of bit line patterns.

BRIEF DESCRIPTION OF THE DRAWINGS

Exemplary embodiments of the inventive concept will be more clearly understood from the following detailed description taken in conjunction with the accompanying drawings in which:

FIG. 4 is a diagram illustrating a layout of a semiconductor device according to another embodiment of the inventive concept.

DETAILED DESCRIPTION OF THE EMBODIMENTS

Figure 1:
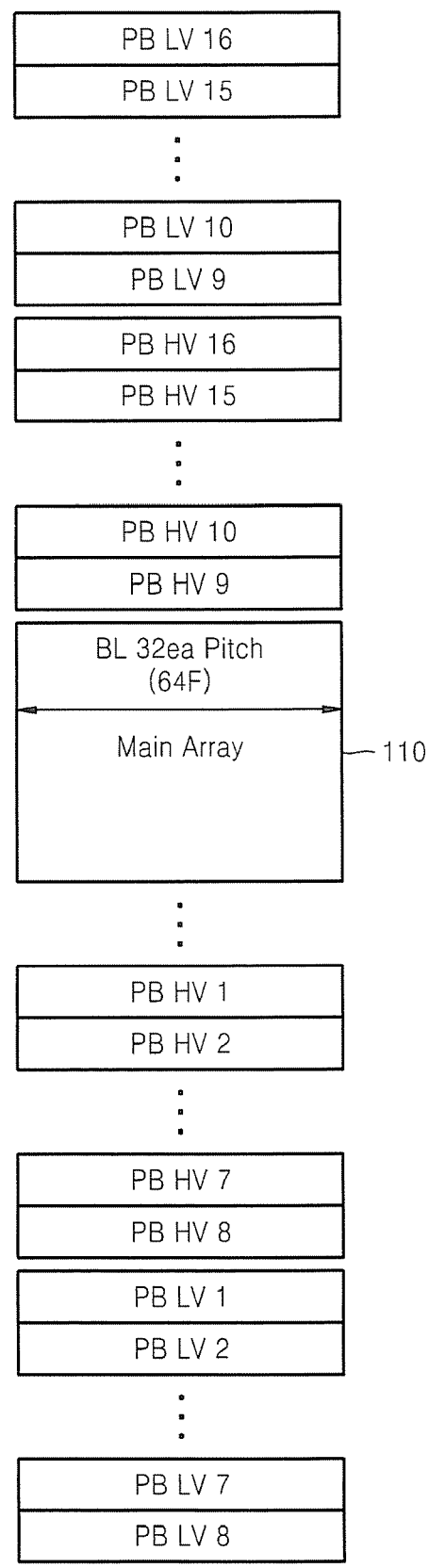
FIG. 1 is a schematic diagram of a semiconductor device according to an embodiment of the inventive concept.

The attached drawings for illustrating exemplary embodiments of the inventive concept are referred in order to gain a sufficient understanding of the inventive concept, the merits thereof, and the objectives accomplished by the implementation of the inventive concept.

Hereinafter, the inventive concept will be described in detail by explaining exemplary embodiments of the invention with reference to the attached drawings. Like reference numerals in the drawings denote like elements.

FIG. 1 is a schematic diagram of a semiconductor device according to an embodiment of the inventive concept.

Referring to FIG. 1, a main array 110 is disposed between page buffer regions PBHV1 through PBLV8 and page buffer regions PBHV9 through PBLV16. The page buffer regions PBHV1 through PBLV8 are sequentially disposed on a side of the main array 110, and the page buffer regions PBHV9 through PBLV16 are sequentially disposed on the other side of the main array 110. Page buffer regions PBHV1 through PBHV16 correspond to a high voltage, and page buffer regions PBLV1 through PBLV16 correspond to a low voltage. A plurality of bit line patterns are formed on the main array 110.

Figure 2:
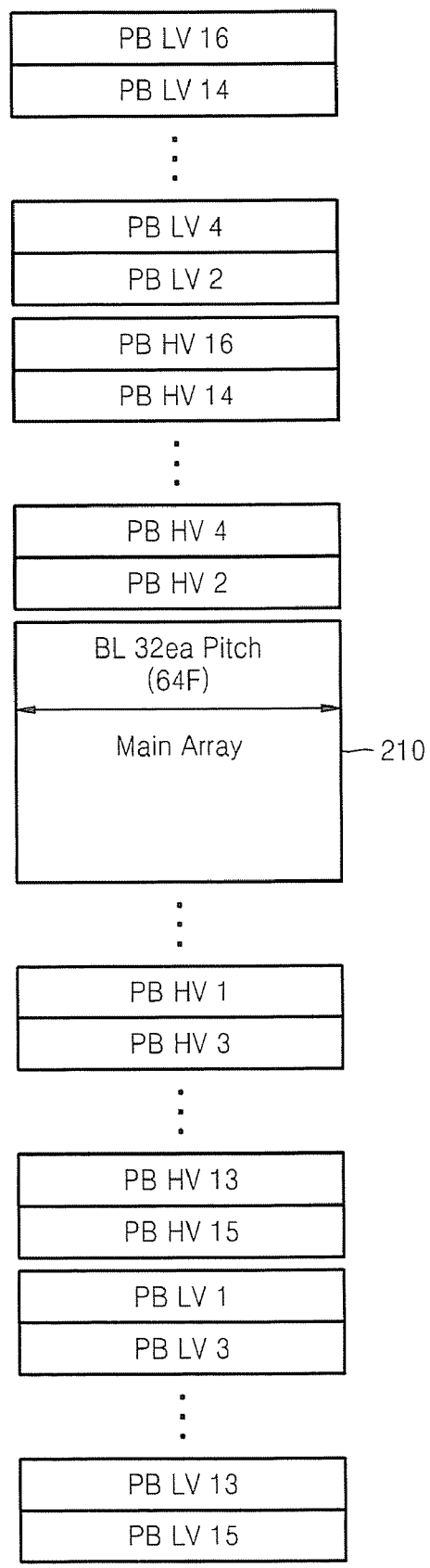
FIG. 2 is a schematic diagram of a semiconductor device according to another embodiment of the inventive concept.

FIG. 2 is a schematic diagram of a semiconductor device according to another embodiment of the inventive concept.

Referring to FIG. 2, page buffer regions PBHV1 through PBHV16 and PBLV1 through PBLV16 are disposed on both sides of a main array 210. The disposition of the page buffer regions PBHV1 through PBHV16 and PBLV1 through PBLV16 illustrated in FIG. 2 is different from the disposition thereof illustrated in FIG. 1.

In FIG. 2, odd-numbered page buffer regions PBHV1 through PBHV15 and PBLV1 through PBLV15 are sequentially disposed on a side of the main array 210, and even-numbered page buffer regions PBHV2 through PBHV16 and PBLV2 through PBLV16 are sequentially disposed on the other side of the main array 210.

Figure 3:
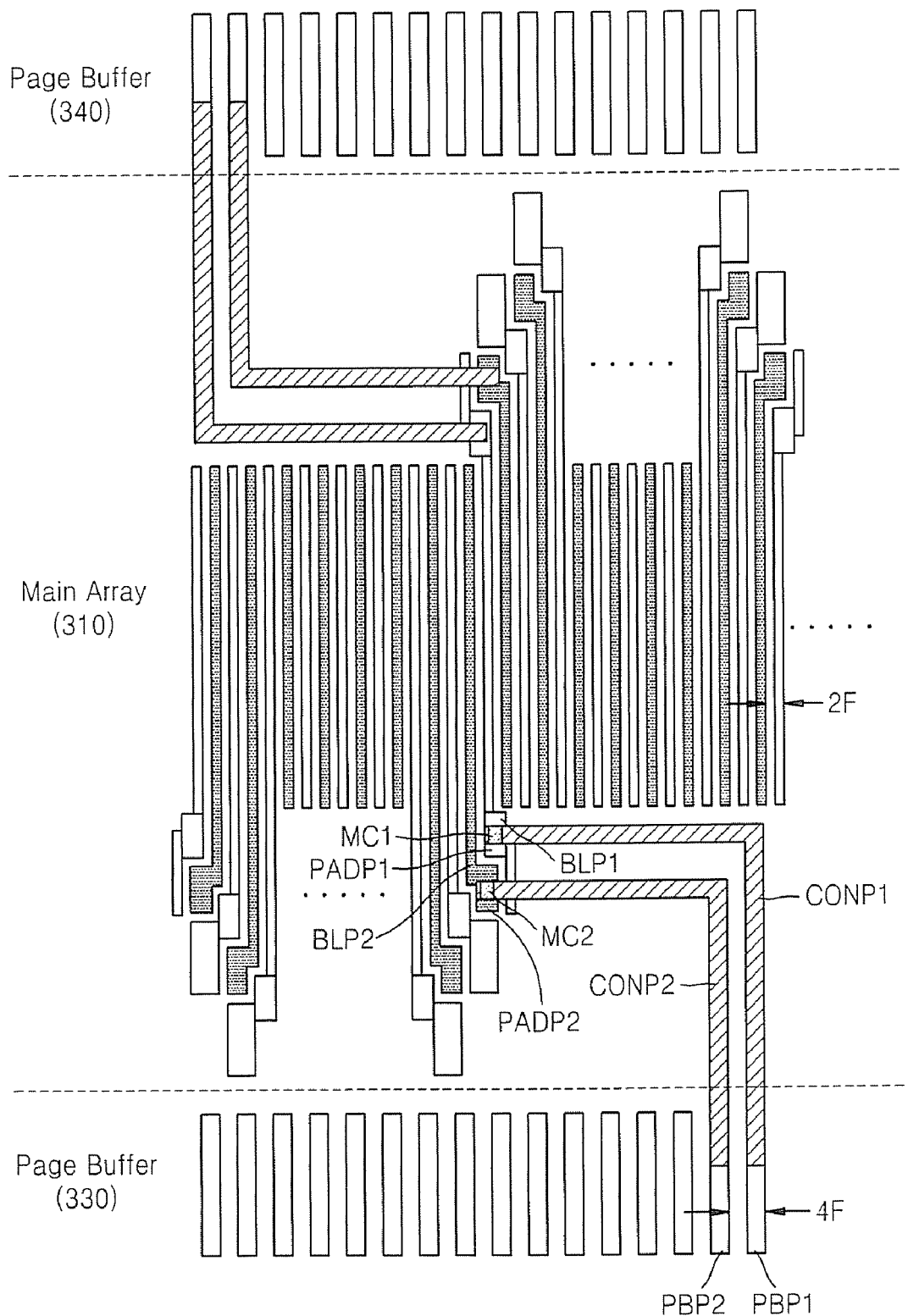
FIG. 3 is a diagram illustrating a layout of a semiconductor device according to an embodiment of the inventive concept.

FIG. 3 is a diagram illustrating a layout of a semiconductor device according to an embodiment of the inventive concept.

Referring to FIG. 3, the semiconductor device according to the present embodiment includes a main array 310, a first page buffer 330, and a second page buffer 340. The main array 310 may belong to a memory cell array region, and the first and second page buffers 330 and 340 may belong to a page buffer region.

A plurality of bit line patterns BLP1 and BLP2 and a plurality of pad patterns PADP1 and PADP2 are formed on the memory cell array region to which the main array 310 belong. The plurality of pad patterns PADP1 and PADP2 are respectively connected to the plurality of bit line patterns BLP1 and BLP2.

In semiconductor manufacturing, the bit line patterns BLP1 and BLP2 may be formed using a double patterning technology (DPT). In this case, the pitch of the bit line patterns BLP1 and BLP2 may be decreased. Referring to FIG. 3, the pitch of the bit line patterns BLP1 and BLP2 is 2 F. Meanwhile, the pitch of the pad patterns PADP1 and PADP2 is greater than the pitch of the bit line patterns BLP1 and BLP2.

Referring to FIG. 3, the lengths of the bit line patterns BLP1 and BLP2 are different from each other. In this regard, when the pad patterns, e.g, PADP1 and PADP2 are respective connected to both ends of the bit line pattern BLP1 and both ends of the bit line pattern BLP2, a position where the bit line pattern BLP1 is connected to the pad pattern PADP1 is different from a position where the bit line pattern BLP2 is connected to the pad pattern PADP2. Accordingly, the bit line patterns BLP1 and BLP2 may be connected to the pad patterns PADP1 and PADP2 having a pitch different from that of the bit line patterns BLP1 and BLP2 in the memory cell array region.

At least one contact MC1 and MC2 may be respectively formed on the pad patterns PADP1 and PADP2. The contacts MC1 and MC2 may be formed by metal contact, but may be formed using other various materials. The contacts MC1 and MC2 are formed in order to connect patterns formed on different layers with each other. The contacts MC1 and MC2 are vertically perforated to make a predetermined space, and thus there is limitation in decreasing the areas of the contact MC1 and MC2. Therefore, it is difficult to directly form the contacts MC1 and MC2 on the bit line patterns BLP1 and BLP2 (Take into consideration that since the bit line patterns BLP1 and BLP2 are formed using the DPT, the pitch thereof is small). To address this problem, the bit line patterns BLP1 and BLP2 are respectively connected to the pad patterns PADP1 and PADP2, and the contacts MC1 and MC2 are respectively formed on the pad patterns PADP1 and PADP2.

The pad pattern PADP1 is connected to a connect pattern CONP1 via the contact MC1, and the pad pattern PADP2 is connected to a connect pattern CONP2 via the contact MC2. In the page buffer region to which the first page buffer 330 and the second page buffer 340 belong, the connect patterns CONP1 and CONP2 are respectively connected to page buffer patterns PBP1 and PBP2. The connect patterns CONP1 and CONP2 and the page buffer patterns PBP1 and PBP2 may be formed on a layer that is upper or lower than the layer on which the bit line patterns BLP1 and BLP2 and the pad patterns PADP1 and PADP2 are formed.

As described above, the bit line patterns BLP1 and BLP2 may be formed using the DPT; however, it is difficult to form the page buffer patterns PBP1 and PBP2 using the DPT. Thus, when the DPT is used to form the bit line patterns BLP1 and BLP2, the pitch thereof is decreased. Accordingly, the pitch of the page buffer patterns PBP1 and PBP2 is greater than the pitch of the bit line patterns BLP1 and BLP2. Referring to FIG. 3, the pitch of the page buffer patterns PBP1 and PBP2 is 4 F (Compare it with the pitch (2 F) of the bit line patterns BLP1 and BLP2 illustrated in FIG. 3).

In addition, the connect patterns CONP1 and CONP2 are connected to the page buffer patterns PBP1 and PBP2, and thus the pitch of the connect patterns CONP1 and CONP2 may be the same as the pitch of the page buffer patterns PBP1 and PBP2.

FIG. 4 is a diagram illustrating a layout of a semiconductor device according to another embodiment of the inventive concept.

Referring to FIG. 4, the semiconductor device according to the present embodiment includes a main array 410, a first page buffer 430, a second page buffer 4, third page buffer 450, and a fourth page buffer 460. The main array 410 may belongs to a memory cell array region, and the first page buffer 430, the second page buffer 440, the third page buffer 450, and the fourth page buffer 460 may belong to a page buffer region.

A plurality of bit line patterns BLP1 through BLP6 are formed on the main array 410. A plurality of page buffer patterns PBP1 through PBP6 are formed in the page buffer region.

The bit line patterns BLP1 through BLP6 connected to the page buffer patterns PBP1 through PBP6 in the page buffer region. For example, the bit line patterns BLP1 and BLP2 may be respectively connected to the page buffer patterns PBP1 and PBP2 in the page buffer region to which the first page buffer 430 belongs, and the bit line patterns BLP3 and BLP4 may be respectively connected to the page buffer patterns PBP3 and PBP4 in the page buffer region to which the third page buffer 450 belongs. In addition, the page buffer patterns PBP1 through PBP6 in the page buffer regions to which the first and third page buffers 430 and 450 belong may be connected to page buffer patterns PBP7 and PBP8 in the page buffer regions to which the second and fourth page buffers 440 and 460 belong.

The pitch of the page buffer patterns PBP1 through PBP8 is greater than the pitch of the bit line patterns BLP1 through BLP6. Referring to FIG. 4, the pitch of the page buffer patterns PBP1 through PBP8 is 4 F, and the pitch of the bit line patterns BLP1 through BLP6 is 2 F. In addition, as illustrated in FIG. 4, the width of the page buffer patterns PBP1 through PBP8 may be 3 F, and a distance between any two of the page buffer patterns PBP1 through PBP8 may be 1 F.

The page buffer patterns PBP1 through PBP8 may be formed on the same layer as that on which the bit line patterns BLP1 through BLP6 are formed (In FIG. 3, the page buffer patterns are formed on a layer that is different from the layer on which the bit line patterns are formed).

A layout method for a semiconductor device according to an embodiment of the inventive concept will now be described with reference to FIG. 3.

The plurality of bit line patterns BLP1 and BLP2 are formed on a first layer. The bit line patterns BLP1 and BLP2 may be formed using a DPT.

Next, the plurality of pad patterns PADP1 and PADP2 are formed on the first layer and are respectively connected to an end of the bit line pattern BLP1 and an end of the bit line pattern BLP2. The pitch (for example, 4 F) of the pad patterns PADP1 and PADP2 may be greater than the pitch (for example, 2 F) of the bit line patterns BLP1 and BLP2. The bit line patterns BLP1 and BLP2 and the pad patterns PADP1 and PADP2 are formed in a memory cell array region of the semiconductor device. The pad patterns, e.g., PADP1 are connected to both ends of the bit line pattern BLP1, and the pad patterns, e.g., PADP2 are connected to both ends of the bit line pattern BLP2.

Subsequently, the plurality of page buffer patterns PBP1 and PBP2 are formed on a second layer that is formed upper than the first layer. Then, a plurality of connect patterns CONP1 and CONP2, which are connected to the pad patterns PADP1 and PADP2, are formed on the second layer. The pitch of the connect patterns CONP1 and CONP2 may be greater than the pitch of the bit line patterns BLP1 and BLP2, and may be the same as the pitch of the page buffer patterns PBP1 and PBP2.

Lastly, at least one contact MC1 is formed so as to vertically connect the pad pattern PADP1 on the first layer with the connect pattern CONP1 on the second layer, and at least one contact MC2 is formed so as to vertically connect the pad pattern PADP2 on the first layer with the connect pattern CONP2 on the second layer.

A layout method for a semiconductor device according to another embodiment of the inventive concept will now be described with reference to FIG. 4.

The plurality of bit line patterns BLP1 through BLP6 are formed on a first layer. Then, the plurality of page buffer patterns PBP1 through PBP8 are formed on the first layer, and the page buffer patterns PBP1 through PBP6 are respectively connected to the bit line patterns BLP1 through BLP6. The page buffer patterns PBP3 and PBP4 are respectively connected to the bit line patterns BLP3 and BLP4 in the page buffer region to which the third page buffer 450 belongs, and the page buffer patterns PBP1, PBP2, PBP5 and PBP6 are respectively connected to the bit line patterns BLP1, BLP2, BLP5 and BLP6 in the page buffer region to which the first page buffer 430 belongs. The pitch of the page buffer patterns PBP1 through PBP8 is greater than the pitch of the bit line patterns BLP1 through BLP6.

As described above, in a semiconductor device according to the inventive concept, bit line patterns and page buffer lines having a pitch different from the pitch of the bit line patterns can be connected to each other.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
a plurality of bit line patterns;
a plurality of pad patterns that are respectively connected to the plurality of bit line patterns; and
at least one contact that is formed on each of the plurality of pad patterns,
wherein the pitch of the plurality of pad patterns is greater than the pitch of the plurality of bit line patterns.

2. The semiconductor device of claim 1, wherein the plurality of bit line patterns and the plurality of pad patterns are formed in a memory cell array region of the semiconductor device.

3. The semiconductor device of claim 1, wherein the lengths of the plurality of bit line patterns are different from each other, some of the plurality of pad patterns are respectively connected to ends of some of the plurality of bit line patterns having lengths different from one another, and the remaining pad patterns are respectively connected to the other ends of the remaining bit line patterns having lengths different from one another.

4. The semiconductor device of claim 1, further comprising a plurality of page buffer patterns that are respectively connected to the plurality of bit line patterns or the plurality of pad patterns via the contact, wherein the pitch of the plurality of page buffer patterns is greater than the pitch of the plurality of bit line patterns.

5. The semiconductor device of claim 4, wherein the plurality of pad patterns are formed on a layer that is the same as a layer on which the plurality of bit line patterns are formed, and the plurality of page buffer patterns are formed on a layer that is different from the layer on which the plurality of bit line patterns are formed.

6. The semiconductor device of claim 5, further comprising connect patterns that are formed on a layer that is the same as a layer on which the plurality of page buffer patterns are formed, wherein the connect patterns are respectively connected to the plurality of page buffer patterns and respectively connected to the plurality of pad patterns via the contact.

7. The semiconductor device of claim 6, wherein the pitch of the connect patterns is greater than the pitch of the plurality of bit line patterns, and is the same as the pitch of the plurality of page buffer patterns.

8. The semiconductor device of claim 1, wherein the plurality of bit line patterns is formed using a double patterning technology (DPT).

9. The semiconductor device of claim 1, wherein the contact is formed by metal contact.

10. A semiconductor device comprising:
a plurality of bit line patterns; and
a plurality of page buffer patterns that are respectively connected to the plurality of bit line patterns,
wherein the plurality of bit line patterns are connected to the plurality of page buffer patterns in a page buffer region, and the pitch of the plurality of page buffer patterns is greater than the pitch of the plurality of bit line patterns.

11. The semiconductor device of claim 10, wherein the plurality of page buffer patterns are formed on a layer that is the same as a layer on which the plurality of bit line patterns are formed.

12. The semiconductor device of claim 10, wherein some of the plurality of page buffer patterns are respectively connected to ends of some of the plurality of bit line patterns, and the remaining page buffer patterns are respectively connected to the other ends of the remaining bit line patterns.

13. A layout method for a semiconductor device, the method comprising:
  forming a plurality of bit line patterns on a first layer;
  forming a plurality of pad patterns on the first layer, wherein the plurality of pad patterns are respectively connected to ends of the plurality of bit line patterns;
  forming a plurality of page buffer patterns on a second layer that is formed upper than the first layer;
  forming a plurality of connect patterns on the second layer, wherein the plurality of connect patterns are respectively connected to the plurality of pad patterns; and
  forming at least one contact that vertically connects the plurality of pad patterns on the first layer and the plurality of connect patterns on the second layer,
  wherein the pitch of the plurality of pad patterns is greater than the pitch of the plurality of bit line patterns.

14. The layout method of claim 13, wherein the plurality of bit line patterns and the plurality of pad patterns are formed in a memory cell array region of the semiconductor device.

15. The layout method of claim 13, wherein some of the plurality of pad patterns are respectively connected to ends of some of the plurality of bit line patterns having lengths different from one another, and the remaining pad patterns are respectively connected to the other ends of the remaining bit line patterns having lengths different from one another.

16. The layout method of claim 13, wherein the pitch of the plurality of connect patterns is greater than the pitch of the plurality of bit line patterns, and is the same as the pitch of the plurality of page buffer patterns.

17. The layout method of claim 13, wherein the plurality of bit line patterns are formed using a double patterning technology (DPT).

18. A layout method for a semiconductor device, the method comprising:
  forming a plurality of bit line patterns on a first layer; and
  forming a plurality of page buffer patterns on the first layer, wherein the plurality of page buffer patterns are respectively connected to the plurality of bit line patterns in a page buffer region,
  wherein some of the plurality of page buffer patterns are respectively connected to ends of some of the plurality of bit line patterns, and the remaining page buffer patterns are respectively connected to the other ends of the remaining bit line patterns, and the pitch of the plurality of page buffer patterns is greater than the pitch of the plurality of bit line patterns.

* * * * *